United States Patent
Staszewski

(10) Patent No.: US 7,076,513 B2
(45) Date of Patent: Jul. 11, 2006

(54) METHOD AND ARCHITECTURE FOR CONTROLLING ASYMMETRY OF AN LMS ADAPTATION ALGORITHM THAT CONTROLS FIR FILTER COEFFICIENTS

(75) Inventor: Robert B. Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 663 days.

(21) Appl. No.: 10/230,041

(22) Filed: Aug. 28, 2002

(65) Prior Publication Data

US 2004/0044712 A1    Mar. 4, 2004

Related U.S. Application Data

(60) Division of application No. 09/410,510, filed on Oct. 1, 1999, now Pat. No. 6,618,740, and a continuation-in-part of application No. 09/258,594, filed on Feb. 26, 1999, now Pat. No. 6,442,197, and a continuation-in-part of application No. 09/258,827, filed on Feb. 25, 1999, now Pat. No. 6,587,529, and a continuation-in-part of application No. 09/256,420, filed on Feb. 24, 1999, now Pat. No. 6,636,572, and a continuation-in-part of application No. 09/224,364, filed on Dec. 31, 1998, now Pat. No. 6,243,729.

(60) Provisional application No. 60/122,219, filed on Mar. 1, 1999.

(51) Int. Cl.
*G06F 17/10* (2006.01)

(52) U.S. Cl. ...................................................... 708/322
(58) Field of Classification Search ................ 708/322
See application file for complete search history.

(56) References Cited

U.S. PATENT DOCUMENTS

| | | | | |
|---|---|---|---|---|
| 5,590,154 A | * | 12/1996 | Forni et al. | 375/229 |
| 5,650,954 A | * | 7/1997 | Minuhin | 708/819 |
| 5,793,820 A | * | 8/1998 | Vander Mey | 375/350 |
| 5,887,059 A | * | 3/1999 | Xie et al. | 379/406.09 |
| 6,222,879 B1 | * | 4/2001 | Cideciyan et al. | 375/233 |

* cited by examiner

*Primary Examiner*—Chuong D. Ngo
(74) *Attorney, Agent, or Firm*—Alan K. Stewart; W. James Brady, III; Frederick J. Telecky, Jr.

(57) ABSTRACT

A circuit (48) and method, which can be used in a mass data storage device, controls adaptation asymmetry of coefficients of an FIR filter (20) using an accumulator (52) or accumulating correlation results between unequalized FIR filter input data samples and FIR filter output equalized error samples. A circuit (52) generates coefficient increment and decrement requests from the accumulated correlation results. A circuit (120,102',122) updates the coefficients within a symmetric coefficient pair on the basis of the increment and decrement requests only if a predetermined nonzero coefficient magnitude difference between the coefficient pair would not be exceeded by the update. In one embodiment of the invention, circuit (52) and method are provided for generating coefficients for an FIR filter in a sign-sign LMS algorithm using an accumulator for accumulating in a sub-least significant bit register (54) successive sign values of an error between input data samples to the FIR filter and output error samples from the FIR filter and an increment/decrement circuit (64) to request an increment/decrement of a coefficient value of the FIR flter on the basis of carry-out and borrow-in operations of the sub-least significant bit register (54).

6 Claims, 6 Drawing Sheets

| | | | | LO GATE | | MID GATE | | HI GATE | | SELECTION |
|---|---|---|---|---|---|---|---|---|---|---|
| | | | | UD | | UD | | UD | | CONTROLLED BY MEM_LMS_DIF |
| 0 | 1 | 1 | 1 | 0 | 1 | 0 | 1 | 0 | 1 | |
| 0 | 1 | 1 | 0 | 0 | 1 | 0 | 1 | 0 | 1 | |
| 0 | 1 | 0 | 1 | 0 | 1 | 0 | 1 | 1 | 1 | |
| 0 | 1 | 0 | 0 | 0 | 1 | 0 | 1 | 1 | 1 | |
| 0 | 0 | 1 | 1 | 0 | 1 | 0 | 1 | 1 | 1 | |
| 0 | 0 | 1 | 0 | 0 | 1 | 1 | 1 | 1 | 1 | |
| 0 | 0 | 0 | 1 | 0 | 1 | 1 | 1 | 1 | 1 | |
| 0 | 0 | 0 | 0 | 1 | 1 | 1 | 1 | 1 | 1 | |
| 1 | 1 | 1 | 1 | 1 | 0 | 1 | 1 | 1 | 1 | |
| 1 | 1 | 1 | 0 | 1 | 0 | 1 | 1 | 1 | 1 | |
| 1 | 1 | 0 | 1 | 1 | 0 | 1 | 0 | 1 | 1 | |
| 1 | 1 | 0 | 0 | 1 | 0 | 1 | 0 | 1 | 1 | |
| 1 | 0 | 1 | 1 | 1 | 0 | 1 | 0 | 1 | 1 | |
| 1 | 0 | 1 | 0 | 1 | 0 | 1 | 0 | 1 | 0 | |
| 1 | 0 | 0 | 1 | 1 | 0 | 1 | 0 | 1 | 0 | |
| 1 | 0 | 0 | 0 | 1 | 0 | 1 | 0 | 1 | 0 | |

METHOD AND ARCHITECTURE FOR CONTROLLING ASYMMETRY OF AN LMS ADAPTATION ALGORITHM THAT CONTROLS FIR FILTER COEFFICIENTS

CROSS REFERENCES TO RELATED APPLICATIONS

This application claims the benefit of prior filed patent application ser. No. 09/410,510 filed Oct. 1, 1999, now U.S. Pat. No. 6,618,740 the patent to the instant divisional application and copending provisional application Ser. No. 60/122,219, filed Mar. 1, 1999.

This application is a continuation-in-part of patent application Ser. No. 09/224,364, filed Dec. 31, 1998, now U.S. Pat. No. 6,243,729 which is hereby incorporated by reference.

This application is a continuation-in-part of patent application Ser. No. 09/256,420, filed Feb. 24, 1999, now U.S. Pat. No. 6,636,572 wnich is hereby incorporated by reference.

This application is a continuation-in-part of patent application Ser. No. 09/258,594, filed Feb. 26, 1999, now U.S. Pat. No. 6,442,197 which is hereby incorporated by reference.

This application is a continuation-in-part of patent application Ser. No. 09/258,827, filed Feb. 25, 1999, now U.S. Pat. No. 6,587,529 which is hereby incorporated by reference.

BACKGROUND OF THE INVENTION

1. Field of the Invention

This invention relates to improvements in methods for operating a mass data storage device having an FIR filter in a read channel thereof that uses PRML equalization and dynamic coefficients, and more particularly to improvements in methods for modifying the dynamic coefficients thereof, and to improvements in mass data storage devices, filters used therein in PRML equalization environments, and more particularly to circuits for modifying the dynamic coefficients thereof.

2. Relevant Background

The PRML equalizaton of a magnetic recording read channel, is usually accomplished by a continuous-time filter, CTF, that is implemented using analog technique, followed by a finite-impulse response filter, FIR. The FIR filter can be implemented in one of two ways: either in a sampoed analog fashion or in a pure digital fashion. In the former case, a sample-and-hold circuit separates the CTF and FIR, whereas in the latter case, an analog-to-digital converter, ADC, separates the two blocks.

The chief purpose of the CTF filter is to provide an anti-aliasing filter to limit the spectral contents of the signal and noise beyond the Nyquist frequency. However, CTF filter are inherently difficult to tune and adapt. It is the FIR filter, nowadays that plays the najor role in achieving a fine signal equalization to the desired PRML targer. With the advent of deep sumicron CMMOS processes, the digital FIR filters with sophisticated Least Mean Square, LMS, coefficient adaptation algorithms are becoming less and lest costly, whereas the analog CTF circuits do not scale down very well. The LMS adaptation fo FIR coefficients is customarilyu done using a sign-sign LMS algorithm. Here, only a sign bit of the unequalized input data sample and a sign bit of the corresponding equalized output data sample error are used, instead of their full value representations.

Magneto-resistive heads have been recently more popular than their thin-film inductive head counterparts. This is due mainly to their lower cost. However, their response transfer function is nonsymmetric or positive and negative pulses, as well as the leading and trailing edges, and it exhibits a larger amount of nonlinearities.

There are two kinds of FIR cnnfigurations that are used to ensure its generally linear phase characteristic: odd- and even-symmetricity of the unit pulse response sequence. The linear phase property is required to minimize the frequency dispersion effects by nonlinear phase response in any data transmission application. However, a slight deviation from the perfect coefficient symmetricity is beneficial to compensate for the non-linear characteristics of MR heads and CTF filters.

Due to the problems of loop contention between the timing recovery and FIR coefficients adaptation loops, a symmetric-manner of coefficients adaptation is usually enforced. Not doing so is likely to cause a "runaway" situation for both loops. Oven though the initial FIR coefficient settings do not have to be symmetric, the LMS adaptation will be incomplete and not able to automatically compensate for the signal nonlinearities.

SUMMARY OF THE INVENTION

The invention bridges the gap between the unrestricted coefficient adaptation that is capable of compensating high amount of signal nonlinearities but is likely to cause system instabilities, and the symmetric coefficient adaptation constraint that ensures FIR group delay stability.

Thus, in accordance with a broad aspect of the invention, a method for controlling adaptation asymetry of coefficients of an FIR filter is presented in which the FIR coefficients are grouped into symmetric pairs. Correlation results between unequalized FIR filter input data samples and FIR filter equalized output error samples are accumulated. Coefficient update information is generated from the accumulated correlation results, and the coefficients within each symmetric pair are updated on the basis of the generated coefficient update information only if a nonzero limit of permitted coefficient asymmetry would not be exceeded by the update. The correlation results may be accumulated as successive sign values of an error between input samples to and output error samples from the FIR filter, and the coefficient update information may be generated by requesting an increment and decrement of a coefficient value of the FIR filter on the basis of carry-out and borrow-in operations of the least significant bit register, respectively.

According to another broad aspect of the invention, a method is presented for controlling adaptation asyimetry of coefficients of an FIR filter following a continuous time filter for limiting signal aliasing beyond the Nyquist frequency. The method includes grouping the FIR coefficients into symmetric pairs to follow a unit pulse response property of a linear phase response filter, and accumulating correlation results between unequalized input data samples and equalized output decision error samples in a correlator filter. The method also includes generating FIR filter coefficient update requests from information from the correlator filter, and updating the coefficients within each symmetric pair on the basis of the generated update requests only if a nonzeero limit of permitted coefficient asymmetry in the FIR would not be exceeded. According to yet another broad aspect of the invention, a method is presented for generating coefficients for an FIR filter in a sign-sign LMS algorithm. The method includes accumulating in a sub-least significant bit register successive sign values of an error between input data samples to the FIR filter and output error samples from the FIR filter. The method also includes, on the basis of carry-out and borrow-in operations of the least significant bit register, respectively requesting an increment and decrement of a coefficient value of the FIR filter.

According to still another broad aspect of the invention, a circuit is presented for controlling adaptation asymmetry of coefficients of an FIR filter. The circuit includes an accumulator for accumulating correlation results between unequalized FIR filter input data samples and FIR filter output equalized error samples and a circuit for generating coefficient increment and decrement requests from the accumulated correlation results. A circuit updates he coefficients within a symmetric coefficient pair on the basis of the increment and decrement requests only if a predetermined nonzero coefficient magnitude difference between the coefficient pair would not be exceeded by the update. The circuit for updating the coefficients may include a circuit for determining a coefficient magnitude difference between a coefficient pair, a decoder to determine if the coefficient magnitude difference has not exceeded a predetermined value, and an arbiter circuit for issuing a coefficient update instruction if the decoder has determined that the coefficient magnitude difference has not exceeded the predetermined value.

According to still yet another broad aspect of to invention, a circuit is presented for generating coefficients for an FIR filter in a sign-sign LMS algorithm that includes an accumulator for accumulating in a sub-least significant bit register successive sign values of an error between input data samples to the FIR filter and output error samples from the FIR filter an increment/decrement circuit requests an increment/decrement of a coefficient value of the FIR filter on the basis of carry-out and borrow-in operations of the least significant bit register.

In accordance with yet another broad aspect of the invention, a mass data storage device, having a read channel with an FIR filter, is presented. The circuit has accumulator for accumulating correlation results between unequalized FIR filter input data samples and FIR filter output equalized error samples. A circuit generates coefficient increment and decrement requests from the accumulated correlation results. A circuit updates the coefficients within a symmetric coefficient pair on the basis of the increment and decrement requests only if a predetermined nonzero coefficient magnitude difference between the coefficient pair would not be exceeded by the update, wherein an adaptation asymmetry of coefficients of the FIR filter is controlled.

BRIEF DESCRIPTION OF THE DRAWINGS

The invention is illustrated in the accompanying drawings, in which.

In the various figures of the drawing, like reference numerals are used to denote like or similar parts.

DETAILED DESCRIPTION OF THE PREFERRED EMBODIMENTS

The invention is based on the idea of controlled adaptation asymmetry of FIR coefficents. in this method, the FIR coefficients that comprise a symmetric pair are allowed to develop a certain controlled limit of asymmetry. The limit on the amount of controlled asymmetry should be set high enough to allow compensation of signal nonlinearities due to the imperfections of, for example, MR heads and CTF filters, but at the same time be low enough not to cause any significant variations in the FIR group delay.

According to a preferred embodiment of the invention, this is accomplished by grouping the FIR coefficients into symmetric pairs in such a manner that it follows the unit pulse response property of linear phase response filters. Updates of both coefficients within each symmetricity par is controlled by an arbiter state machine that receives update requests for both coefficients. The update requests are generated separately for each coefficient in a "tick" request handshaking state machine that receives and processes coefficient update tick requests from a correlator filter. The correlator filter accumulates the correlation results between the unequalized input data samples and the equalized output decision error samples.

More particularly, in the past, the filter coefficients of the FIR filter that is employed in the read channel of the mass data storage device are modified by a "sign-sign" least means squared (LMS) adaptation algorithm. It is known that the filter coefficients should be symmetrically modified in pairs in order to control the symmetry of the FIR filter. Thus, typically, the coefficients are grouped into outside-to-inside pair groupings; for example, in an implementation in which eight FIR coefficients are employed, the coefficients are typically grouped by associating coefficients numbered 0 and 7, 1 and 6, 2 and 5, and 3 and 4. Then, when one of the coefficient is dynamically modified to change the filter characteristics of the FIR filter, both coefficients of the pair must be modified equally. The failure to equally, between the timing recovery loop and the FIR coefficients adaptation loop. Moreover, by modifying the coefficients in pairs, the phase shift that might otherwise be introduced by the FIR filter is maintained to help ensure that the output from the FIR filter does not compete with the timing recovery function.

Figure 1:
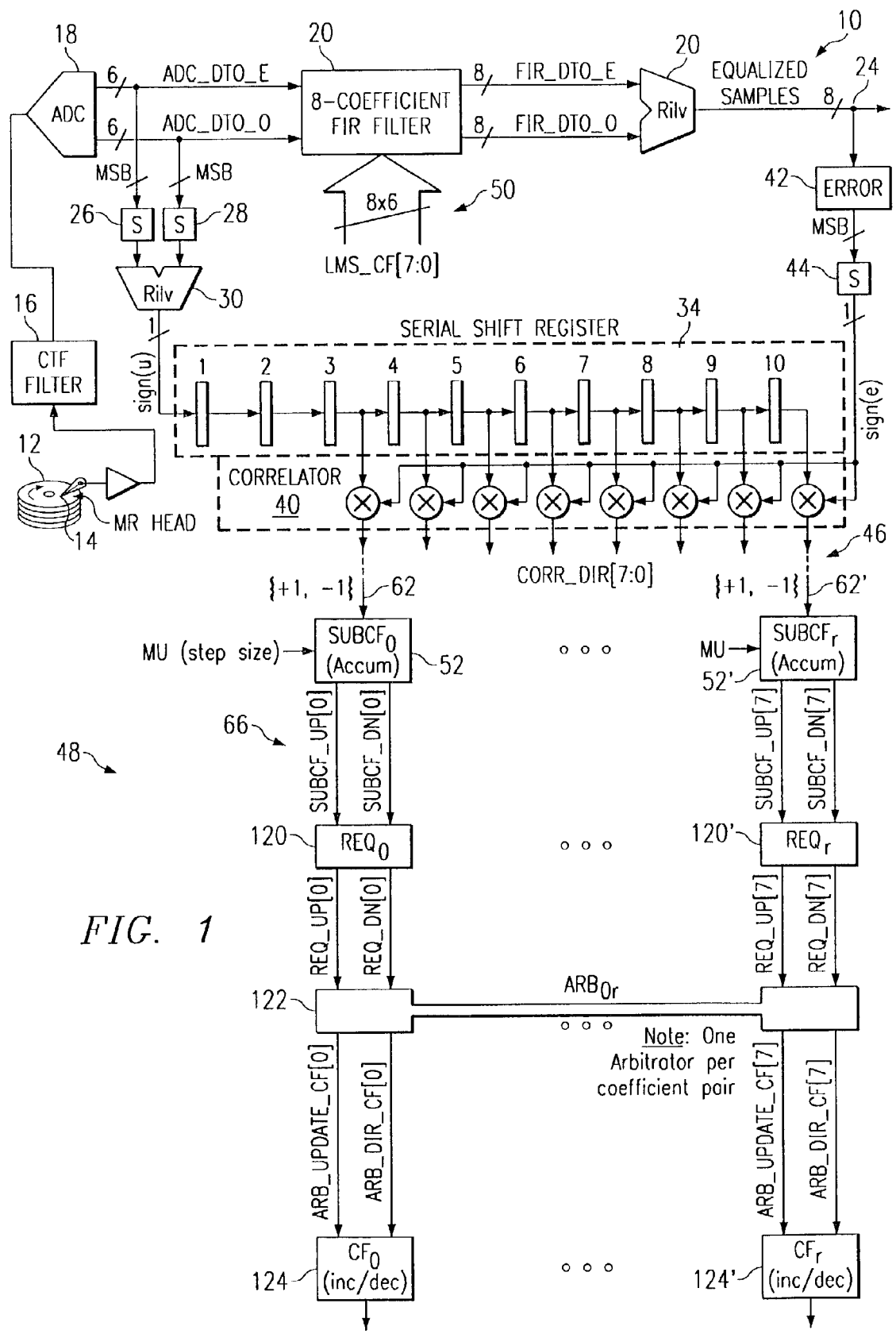
FIG. 1 is a block diagram of a circuit architecture for performing a sign-sign LMS FIR filter coefficient adaptation algorithm, in accordance with a preferred embodiment of the invention.

A block diagram showing an overall "sign-sign" LMS adaptation algorithm and architecture 10 according to a preferred embodiment of the invention is shown in FIG. 1.

The architecture 10 receives a signal from, for example, a hard disk 12 of the type that may be found in mass data storage devices, for use with which the LMS adaptation algorithm and architecture is particularly well suited. Data from the hard disk 12 is read, for instance, by a magneto-resistive head 14, or other suitable transducer, and is filtered by a continuous time filter (CTF) 16. The filtered output from the CTF filter is then converted to a digital signal by an analog to digital converter (ADC) 18 (a sample, hold, and quantity circuit). In the embodiment illustrated, the output from the digitizer is provided in even and odd data streams to an FIR filter 20. The FIR filter 20 may, for example, be of even symmetric type having eight filter coefficients to produce respective even and odd filtered outputs. The even and odd filtered output are combined by a deinterleaver circuit 22 to provide bit-rate equalized data samples on output line 24 for use in the read channel of the mass data storage device with which the circuit 10 is associated.

The coefficients of the FIR filter 20 are dynamically adjusted in operation. More particularly, the sign bits of the unequalized data samples to the FIR filter 20 are processed, first by determining the sign bits of the odd and even input samples by sign determining circuit 26 and 28, respectively, then by reinterleaving the signals by a reinterleaver circuit 30. This provides a bit-rate stream of unequalized sign samples on line 32 at the output of the reinterleaver 30. The signs are shifted through a serial shift register 34 to align them with the FIR-delayed equalized sample errors.

The serial shift register 3 , in the embodiment illustrated, has 10 data sections, numbered 1–10. The outputs from data sections 3–10 are provided to a correlator 40. The correlator 40 provides for each output from the serial shift register sections 3–10 an exclusive-OR (XOR) function or comparison with the sign signal of the equalized samples on output line 24, which is developed by an error circuit 42 and sign determining circuit 44. Thus, at each output station 3–10 of the serial shift register 34, the correlator 40 provides an XOR comparison with the then current sign of the equalized sample on output line 24. The XOR outputs are provided on lines 46 to a coefficient update circuit 48, described below in detail. The coefficient update circuit 48 provides outputs on lines 50 that represent updated FTR filter coefficients, which are fed back to the FIR filter 20.

More particularly, the outputs from the correlator 40 are processed in symmetric pairs to provide coefficients to control the FIR filter 20. For example, in the embodiment illustrated, the coefficients are paired symmetrically, with coefficients [#2] and [#7], coefficients [#1] and [#6], coefficients [#2] and [#5], ana coefficients [#3] and [#4] being paired. As will become apparent, the respective coefficient pairs are constrained to be modifiable only in accordance with a value that will result in the pair being within a predetermined magnitude range difference of each other. For example, the coefficient pair [#0]–[#7] may be modified so that no more than a predetermined magnitude difference, for example, of two, or other predetermined magnitude difference, may result. If an update request is made that would result in a larger magnitude difference than the predetermined value, it may not be made. As a result, the symmetricity of the FIR filter 20 is maintained within a predetermined value amount.

In contrast to the prior art, which accumulated entire LSB correlation results from the correlator, according to the invention, the correlation direction outputs 46 from the correlator 40 are accumulated, and, more particularly, are accumulated in sub-LSB accumulators 52, 52'. As used herein the term "LSB" refers to the Least significant bit (LSB) of the respective FIR coefficients themselves. In the sign-sign adaptation algorithm, only an increment/decrement operation can be performed on the particular coefficient in question. Consequently, herein the term "sub-LSB" refers to a correlation filter accumulator hat accumulates only certain lower ordered portions of the correlation direction outputs and which controls and directly affects the LSBs of the coefficients. Thus, as used herein, the sub-LSB and the correlation fiber accumulators are equivalent, and are referred to as "sub-CF accumulators". Therefore, as the correlation direction data streams no the output lines 46 from the correlator 40 arrive at the sub-CF accumulators, they are accumulated until either an overflow or under-flow boundary is reached. Upon the occurrence of the overflow or underflow condition, a request, herein referred to as a "tick", is made to increment or decrement the coefficient in the data stream in which the over-low or underflow occurred. As will become apparent the tick may or may not be acted upon, depending upon the existing difference that will result with the corresponding paired coefficient with which the coefficient in the data stream in question is paired.

Figure 2:
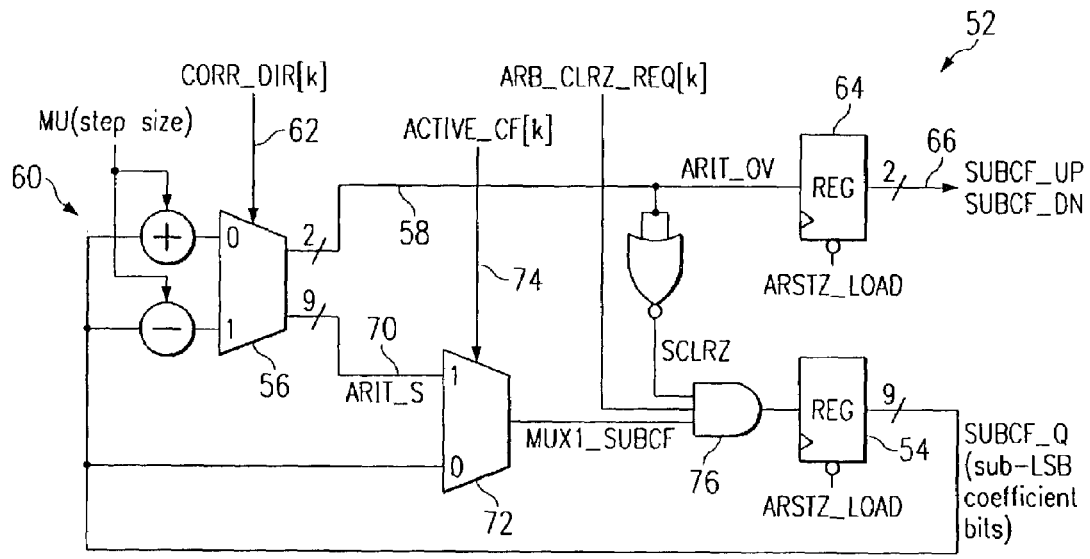
FIG. 2 is a block diagram of a correlation filter of LMS sub-LSB coefficients that may be used in the circuit of FIG. 1.

Details of the correlation filter and accumulator of the LMS sub-LSB coefficient accumulator 52 are shown in FIG. 2, to which reference is now additionally made. Although only one accumulator circuit 52 is shown, it will be understood that similar circuits are employed for each of the coefficient data paths. The accumulator 52 includes a register 54, wnich is initially set to zero. The register 54 contains the sub-least significant bits of the accumulated coefficient, which, in the embodiment shown, may be nine bits wide. The output from the register 54 is connected to the inputs of a multiplexer 56, after having a step size value programmed or statically set and added or subtracted therefrom by a step size precomputing section 60.

The upwardly or downwardly computed sub-LSB portion of the coefficient is selected by the correlation direction signal on line 62 from the correlator 40, shown in FIG. 1. The correlation direction is either plus 1 or minus 1 to select either an increment or decrement to the sub-LSB coefficient. The overflow and underflow bits of the sub-LSB coefficient are selected at the output of the multiplexer 36 on line 56, which indicates that an overflow or underflow conditions has occurred in the operation of the accumulator circuit 32. The values of the overflow and underflow states are held in a register 64 and provided on output lines 66 as a tick requester for either for an up increment or decrement of the overall FIR coefficient in the data stream containing the accumulator 52.

Additionally, the output containing the sub-LSB coefficient from the multiplexer 56 is returned on lines 70 to the register 54 to update its contents. In the embodiment illustrated, a second multiplexer 72 may be provided to select between an operation including the sub-LSB coefficient updates, described above, or an operation which does not include the sub-LSB updates, depending upon the state of the signal on selection line 74. Moreover, resetting the register 54 may be controlled by a signal from an arbitrator, below described in detail, and by the overflow signal on line 58 via an AND gate 76.

Figure 3:
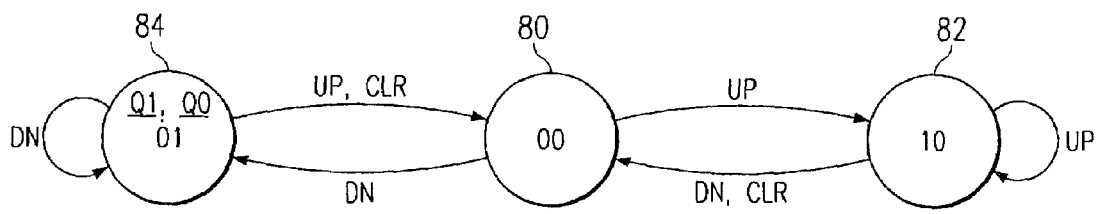
FIG. 3 is a state diagram of an LMS coefficient update state machine, or requestor, that is employed in the operation of the circuit of FIG. 1.

A state diagram explaining the operation of the LMS coefficient update requester is shown in FIG. 3, to Which reference is now additionally made. The state diagram shows the output values Q1 and Q0 in each of three scares. A "1" or high state represents a request to increment (Q1) or decrement (Q0) a coefficient, and a "0" or low state represents no action. The initial state 80 represents a state in which no request has been issued.

When a SUECF_UP input (generated on line 66 of the correlation filter 52 shown in FIG. 2) is received, the requestor changes to state 82, in which Q1 is high, but Q0 is low. If a subsequent SUB_OF up signal or nothing is received, the requestor remains in state 82. From state 32, if a down request, SUB_OF down, is received, the requestor moves back to state 80 until the next input is received. If the next input is an UP input, the state of the requestor returns to state 82. On the other hand, if a DN input is received, the state moves to down state 84, in which the state of Q1 is low and the state of Q0 is high. A subsequent down input, or no input at all, does not change the state of the requestor, which remains in state 84. On the other hand, an up input or clear input returns the requestor state to the Initial state 80 where both Q1 and Q0 are low.

Figure 4:
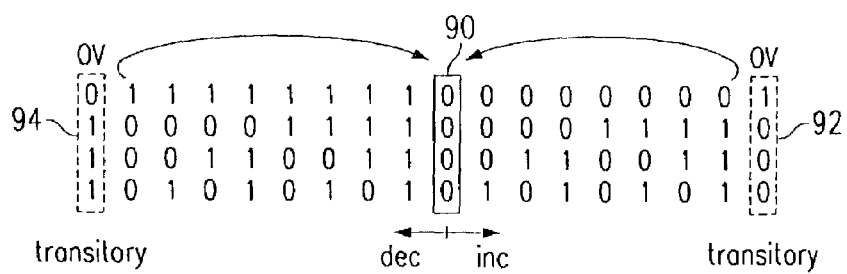
FIG. 4 is a table showing the operation of successive increment and decrement operations by the sub-LSB circuit for use in driving an MS coefficient update request, in accordance with a preferred embodiment of the invention.

Still more particularly, the operation of the accumulator 52 is illustrated in the chart of FIG. 4. The data illustrated in FIG. 4 is for a four-bit accumulator; however, those skilled in the art will recognize that other sized accumulators can equally advantageously be employed. (It is noted, for example, that the size of the accumulator illustrated in FIG. 2 is nine bits wide.) In the operation of the accumulator, as each increment tick request is received, the accumulator moves from an initial state 90 one state to the right in the direction of a final overflow value state 92. When the state 92 is reached, the overflow condition thereof is set, enabling the accumulator to issue a tick request to increment the LMS coefficient.

On the other hand, when a decrement indication is received, the accumulator moves with each indication one step to the left, until a final underflow state 94 is reached. At that point, the accumulator is permitted to issue a decrement tick request, and is reset back to the initial state 90.

It should be noted that the increment and decrement indications are provided by the +1 −1 signals from the correlation direction produced by the correlator 40, shown in FIG. 1. Thus, a buffer-like action is provided by the manner of operation of the accumulator 52 by virtue of the provision of a number of intermediate states that must be traversed before the final overflow or underflow state 92 or 94 respectively may be reached. In fact, if only a few increment indications are received followed by a few decrement indications and so on the overflow and underflow states may never be reached, and, the accumulator may never issue an increment or decrement tick request.

It should also be emphasized, as above mentioned, that the fact that the accumulator has issued an increment or decrement tick request does not automatically guarantee the tick request will be fulfilled. The request, according to a preferred embodiment of the invention, may only be acted upon if it results in an increment or decrement of the coefficient that is within the permitted range of its companion or paired coefficients.

For example, if a predefined range difference of paired coefficients is two, and, for instance, coefficient [#0] is already spaced a distance of 1 in magnitude from its paired coefficient [#7], a request to increment coefficient [#0] by 1 may be permitted, since such increment would increase the spacing between coefficient [#0] and coefficient [#7] to a separation distance of 2.

However, if a subsequent increment request is received to increment the magnitude of coefficient [#0], without a concomitant request to increase the magnitude of coefficient [#7], the increment request cannot be performed. In such case, however, a decrement request can be performed on coefficient [#0], since that would bring the difference between coefficient [#0] and coefficient [#7] to a value of only 1. Additionally, if a range difference of 2 exists and a decrement request is issued to decrement coefficient [#7], that request would increase the range to beyond the predetermined range value allowed, i.e., 2, and the request cannot be accommodated.

This arrangement, therefore, allows for some flexibility in the modification of the FIR coefficients, that allowed a modification of one of the pair of coefficients only with a corresponding modification to the other of the pair. Thu, the timing loop and the LMS. Coefficient loops, by proper definition of the allowed range between coefficient pair values, should be enabled to properly converge on the proper coefficient values of the FIR filter.

Figures 5, 6:
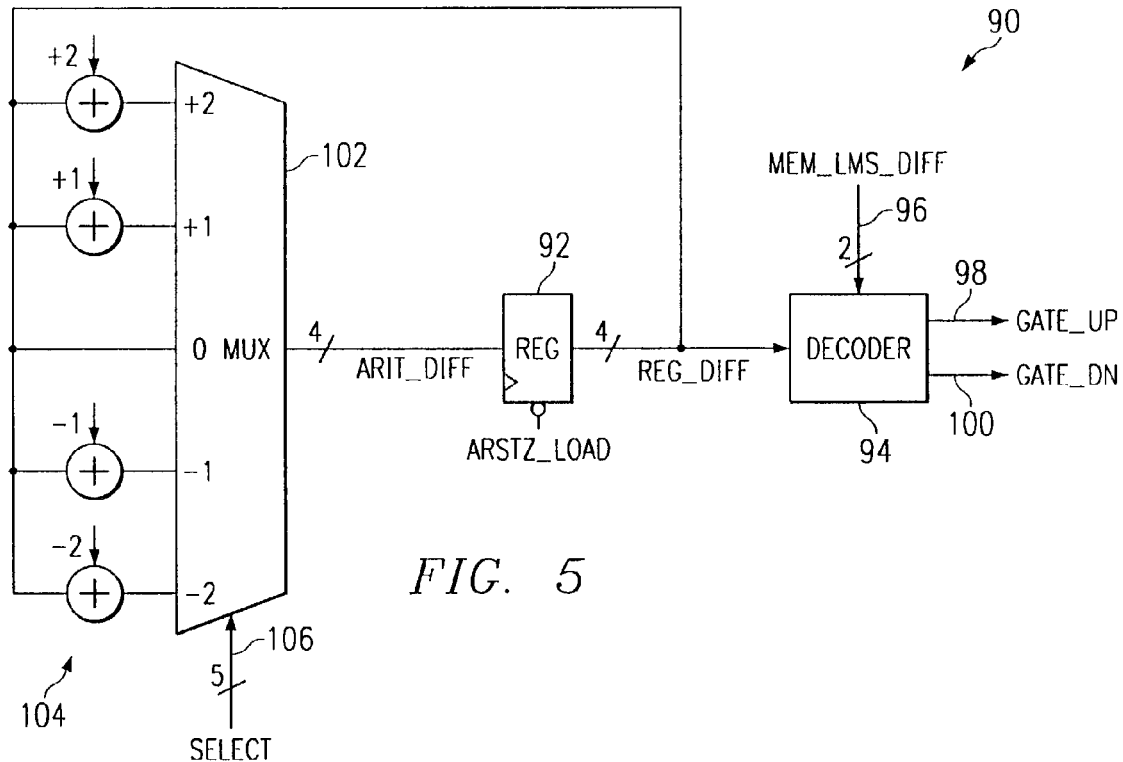
FIG. 5 is a block diagram of an LMS coefficient pair difference state machine that may be used in the circuit of FIG. 1.
FIG. 6 is a able showing the operation of the decoder of the state machine of FIG. 5.
Figure 9:
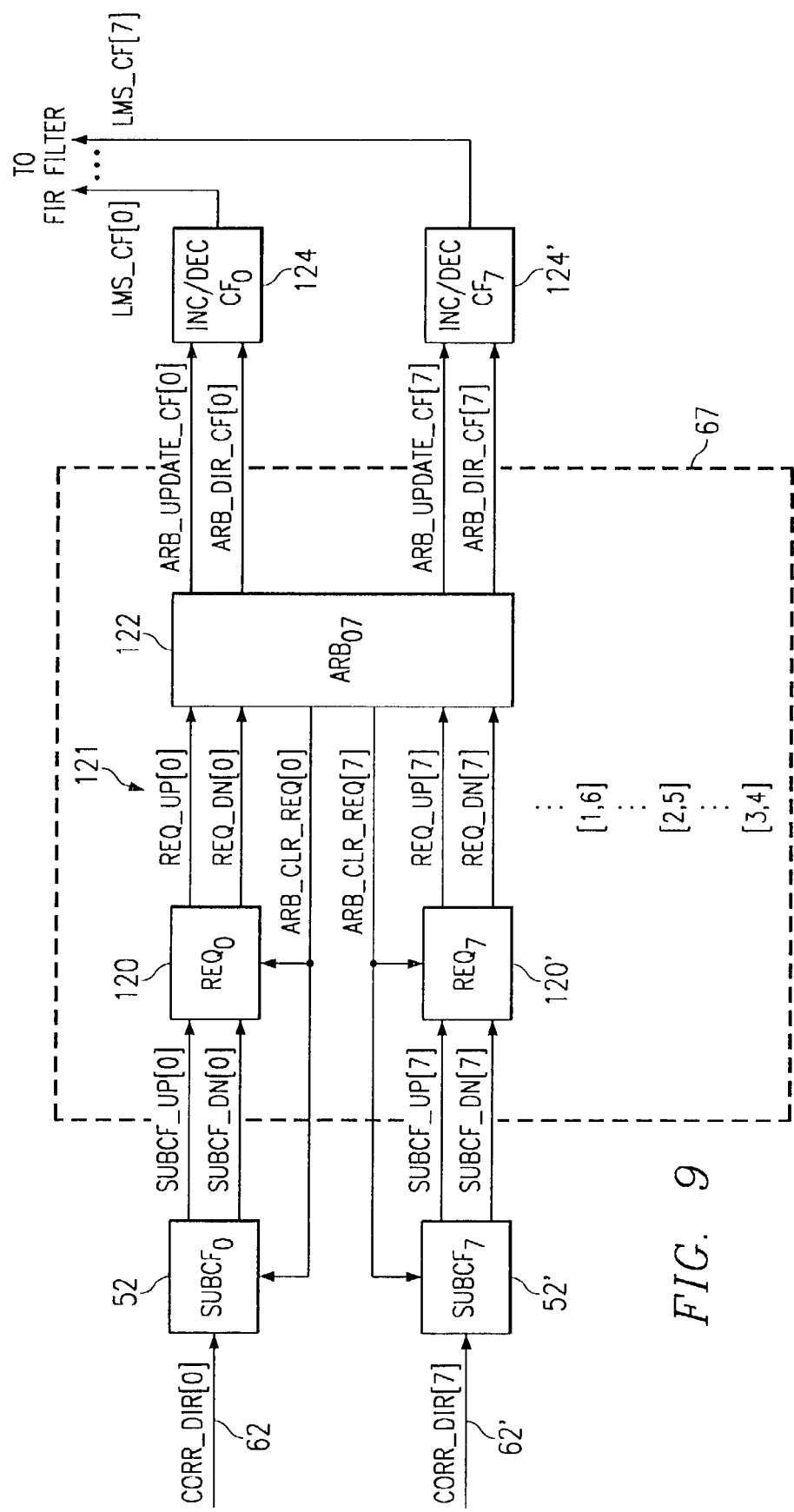
FIG. 9 is a block diagram of a request and arbitration circuit that may be used in the circuit of FIG. 1.

The establishment of the range of permitted values is accomplished in the embodiment illustrated by a state difference state machine 90, illustrated in FIG. 5, to which, reference is now additionally made. In the coefficient pair difference state machine 90, a decoder 94 is provided that maintains a look up table to pass on a permitted increment (GATE_UP) or decrement GATE_DN) request that enables via an arbiter circuit below described in detail with respect to FIGS. 9–10) the increment/decrement circuit 124 (see FIG. 1) to operate.

Figure 7:
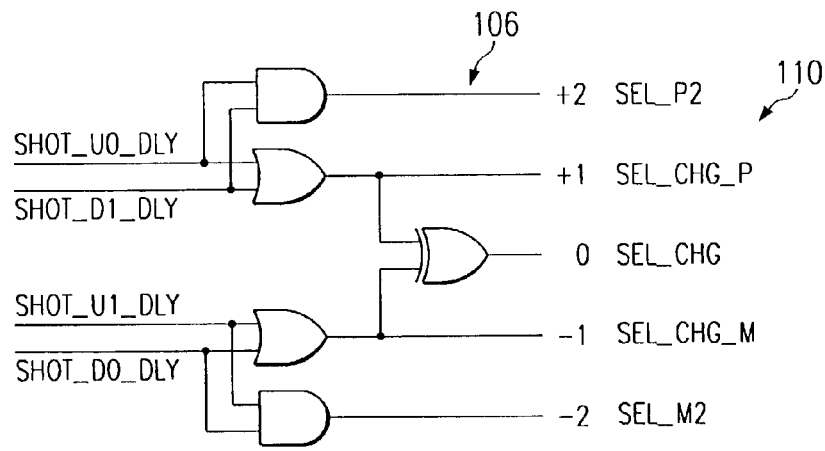
FIG. 7 is a schematic diagram of an update selection circuit that may be used in the implementation of the circuit of FIG. 6.

The pair difference state machine 90 includes a resister 92 that is initially reset. The output from the register 92 is connected to the input of the decoder 94, as described above. The output from the register 92 is additionally fed back to itself through a multiplexer 102 through respective addition circuits 104. The selection of the multiplexer input is made by signals on a select line 106 which are generated according to the selection circuit 110 of FIG. 7, the inputs of which being derived by rising edge detectors (not shown) that detect the U0_GATED, D0_GATED, U1_GATED and D1_GATED signal of FIG. 10.

Figure 8:
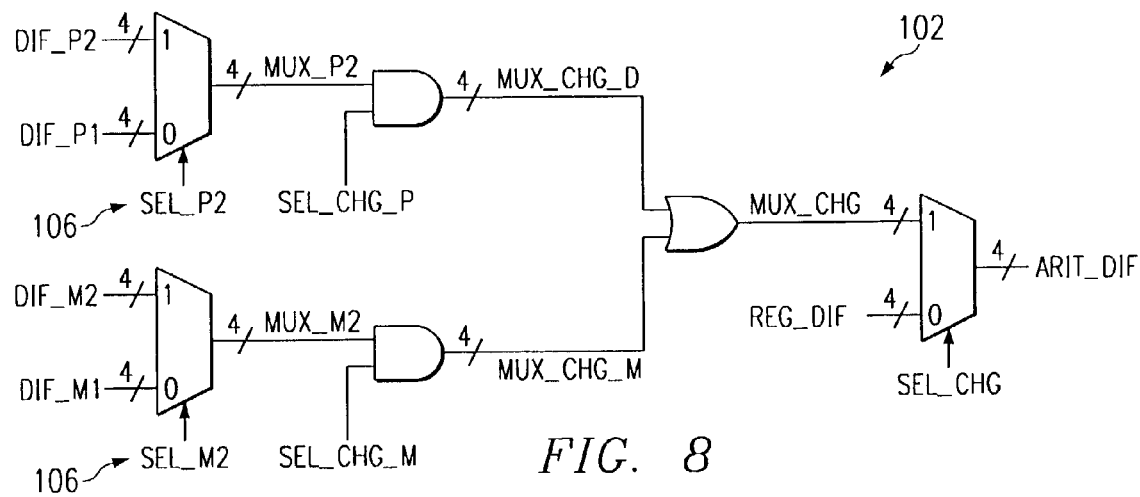
FIG. 8 is a schematic diagram or a multiplex circuit that may be used in the implementation of the circuit of FIG. 6.

Thus, for example, if a request is made that would result in an increase of −2 to the value contained in the register 92, the selection circuit 110 shown in FIG. 8 provides select signals on line 106 to select the +2 input of the multiplexer 102. (It is noted that the addition circuits 104 precalculate the various allowed increment/decrement differences before the selection process carried out by the multiplexer to increase the speed of the overall selection process.) The output of the multiplexer 102 is then applied to the register 92, which then holds the new value for the decoder 94. The circuit 102 of FIG. 8 shows a circuit level diagram for the implementation of the multiplexer 102 and its respective input value.

The operation of the 94 is illustrated with respect to the table shown in FIG. 6, to which reference is now additionally made. As mentioned, the decoder 94 may be a look up table that decodes the range difference established in the register 92 to provide gate up and gate down signals on output lines 98 and 100 when the difference is less than the predetermined range difference. The table in FIG. 6 shows, for example, three possible decoded range value, denoted "LO", and "HI", which represent allowed difference ranges of 2, 4, and 7, respectively, although, of course, any range value may be used. The range may be selected by applying a selected signal on line 96 to the decoder 94 from, for example, a user programmable memory (not snown).

With reference, for example, to the mid range column, "MID" it can be seen that if the output from the register 92 that is applied to the decoder 94 is within a range of plus or minus 2, the up or down enabling valves are set. However, once the value contained in the register 92 exceeds plus 2, only the signal on the gate down line may be enabled. This means that only a request for a down movement of the coefficient in question may be affected. On the other hand, if the value contained in the register 92 is less than −2, only an up value can be effected.

The "LO" and "HI" ranges, if implemented, operate in the same manner as the "MID" range described, but the ranges are less and greater, respectively, than the "MID" range.

The construction of the accumulation, arbitration, and increment/decrement portion 48 of the circuit shown in FIG. 1 is shown in greater detail in FIG. 3, to which reference is now additionally made. Illustrated is a circuit that is associated with a single pair of coefficients, for example, coefficients [#0] and [#7]. Similar circuits, not shown, are provided for the remaining paired coefficients, in the embodiment Illustrated, including coefficients [#1] and [#6], coefficients [#2] and [#5], and coefficients [#3] and [#4].

The output signals on lines 62 and 62' from the correlator 40 (FIG. 1) are shown as inputs to the SUBCF accumulator circuits 52 and 52', which produce one SUBCF increment or decrement tick requests to the requestor circuits 120 and 120'. The requestor circuits 120 and 120' provide the increment and decrement tick requests to an arbiter circuit 122, which outputs arbitration update strobe and direction instructions to increment or decrement the coefficients in boxes 124 and 124'

Figure 10:
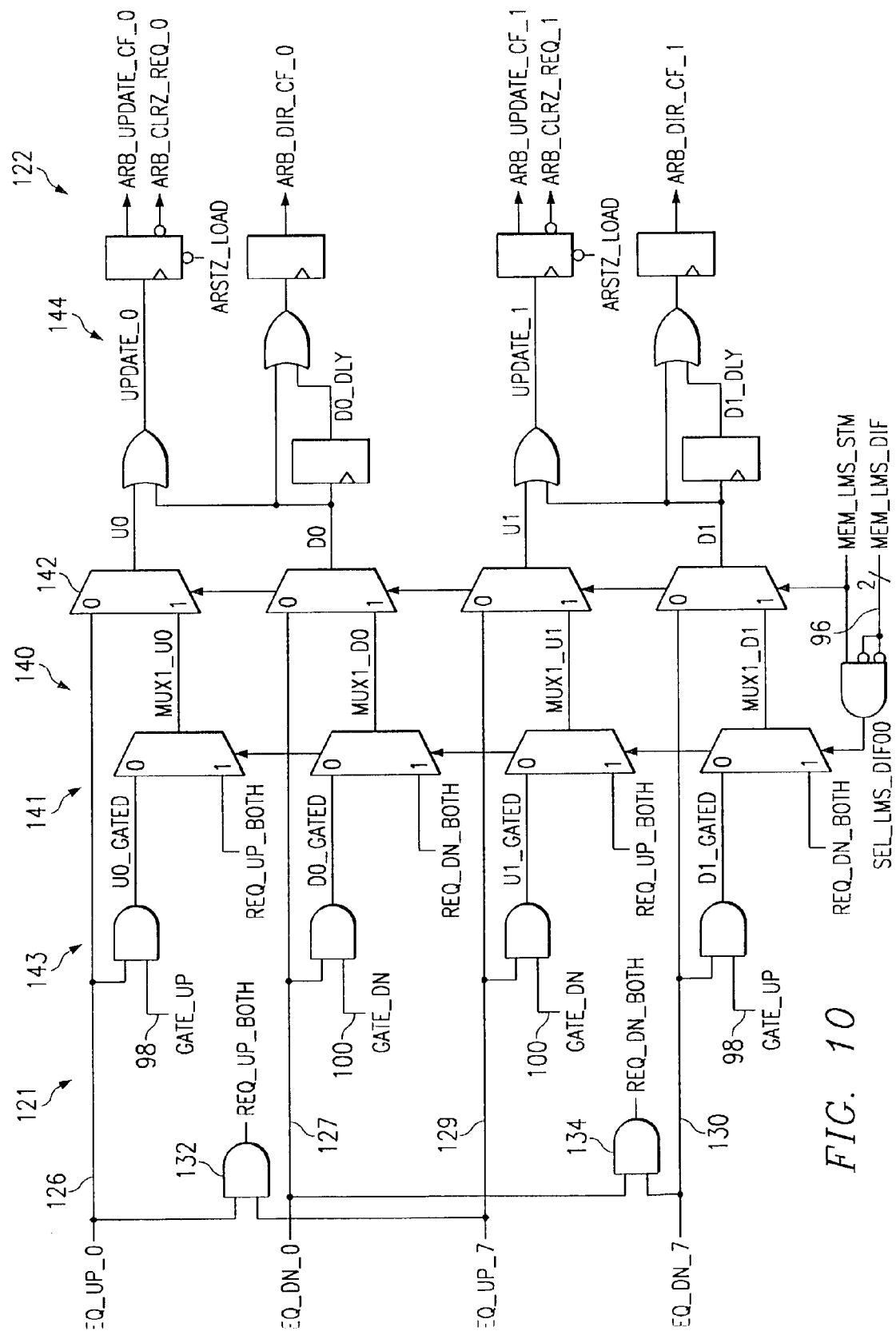
FIG. 10 is a block diagram of an arbiter circuit that may be used in the circuit of FIG. 1.

Details of the arbiter circuit 122 are shown in greater detail in FIG. 10, to which reference is now additionally made. Inputs to the arbiter circuit 122 are provided on lines 121, which are more specifically numbered 126–127 and 129–130 representing the up and down signals provided from the requesters 120 and 120'. The signals on the respective up lines 126 and 129 are compared by AND gate 132, the output of which represents a request for an increment of both coefficients [#0] and [#7], which would not affect the range value therebetween, and which, therefore, would be automatically allowed.

In a similar fashion, the signals on lines 127 and 13C are compared by an AND gate 134, the output of which represents an indication that both coefficient [#0] and [#7] are requested to be decremented, which also is automatically allowed.

The update strobe and direction of the operation to be preformed is determined by the circuit 140, which, in each channel, provides a pair of multiplexers 141 and 142 and an AND gate 143. Each AND gate receives the gate up/down enable signals from the LMS coefficient pair difference state machine 90 above described, together with the tick request signal on one of lines 126–127 and 129–130. Thus, if the gate up/down enable signal is set, and a signal appears on a respective one of lines 126–127 and 129–130, the request is passed to the and gate 143 and the multiplexer 142 in its respective path. Each of the AND gates 143 also receive the GATE_UP or GATE_DN signal from the decoder 94 of FIG. 5, as shown. The outputs from the AND gates 143 are connected to the default input of the multiplexers 141.

The signal selection of the pass states of multiplexers 141 and 142 is controlled by the signals labeled MEM_LMS_SYM and MEM_LMS_DIF. The MEM_LMS_SYM controls whether or not the circuit 122 maintains the symmetry of the FIR coefficients. Thus, if MEM_LMS_SYM is "1", the output from the multiplexers 141 are selected. Otherwise, if MENMLMS_SYM is "0", a brute force operation is selected, in which the signals on lines 126–127 and 129–130 pass, regardless of the affect that they will have on the FIR coefficient symmetry.

Additionally, the signal MEM_LMS_DIF is applied to control the pass state of the multiplexers 141. (MEM_LMS_DIF is the state programmable range selection signal described above with reference to FIGS. 5 and 6.) If both states are low, and symmetry is selected by a high state of MEM_LMS_SYM, only a request to increment or decrement both of the coefficient pair occurs. Otherwise, the default state of the multiplexers 141 is selected, which controls the limit of asymmetry allowed to occur in the coefficient pairs.

It should be noted that even when the mode of operation of the arbiter 122 is similar to the prior art in which only perfect symmetry between coefficient pairs is allowed (MEN_LMS_SYM is "1" and MEM_LMS_DIF is "00"), the circuit 10 provides the advantage that the increment/decrement requests are not lost. For example if an up (or down) request is made to one coefficient, and a down, no, or up request is made to the other, in the past, no action would have been taken, and the requests would have been lost. According to the invention, the requests are accumulated, as above described, so such increment/decrement scenario made to only one of the coefficients would be held until the other coefficient "caught up", or received a corresponding increment or decrement request that would result in preserving perfect symmetry of the coefficients.

The signals that are provided from the gating sage 140 are then separated into update strobe and a direction signal by logic stage 144, which provides the update strobe and direction to each of the increment and decrement circuits 124 and 124', which modify the coefficients and applies them back to the FIR filter 20 (FIG. 1)

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

The invention claimed is:

1. A method for generating coefficients for an FIR filter in a sign-sign LMS algorithm, comprising:
   accumulating in a sub-least significant bit register results of a correlation between successive sign values of a input data samples to said FIR filter and sign values of output error samples from said FIR filter; and
   on the basis of carry-out and borrow-in operations of said sub-least significant bit register, respectively requesting an increment and decrement of a coefficient value of said FIR filter.

2. The method of claim 1 further comprising determining a difference between a pair of FIR filter coefficients, and permitting the increment and decrement only if said difference is less than a nonzero predetermined amount.

3. The method of claim 1 wherein said generating coefficients for an FIR is performed in a read channel of a mass data storage device.

4. A circuit for generating coefficients for an FIR filter in a sign-sign LMS algorithm, comprising:
   an accumulator for accumulating in a least significant bit register results of a correlation between successive sign values of input data samples to said FIR filter and output error samples from said FIR filter; and sign values of
   an increment/decrement circuit to request an increment/decrement of a coefficient value of said FIR filter on the basis of carry-out and borrow-in operations of said least significant bit register.

5. The circuit of claim 4 further comprising a circuit to determine a difference between a pair of FIR filter coefficients, and a circuit to permit the increment/decrement only if said difference is less than a nonzero predetermined amount.

6. The circuit of claim 4 wherein said circuit is in a read channel of a mass data storage device.

* * * * *